US008649469B2

(12) United States Patent
Yu et al.

(10) Patent No.: US 8,649,469 B2
(45) Date of Patent: Feb. 11, 2014

(54) SIGNAL RECEPTION (75) Inventors: Chunyang Yu, Cambridge (GB); Andrei Popescu, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 273 days.

(21) Appl. No.: 13/130,928

(22) PCT Filed: Nov. 2, 2009

(86) PCT No.: PCT/EP2009/064422
§ 371 (c)(1),
(2), (4) Date: Jul. 13, 2011

(87) PCT Pub. No.: WO2010/060734
PCT Pub. Date: Jun. 3, 2010

(65) Prior Publication Data
US 2011/0305304 A1 Dec. 15, 2011

(30) Foreign Application Priority Data

Nov. 26, 2008 (GB) .................................. 0821615.2

(51) Int. Cl.
*H04L 27/06* (2006.01)
(52) U.S. Cl.
USPC ........... 375/343; 375/261; 375/268; 375/316; 375/340; 375/342
(58) Field of Classification Search
USPC ......... 375/219, 229, 261, 268, 295, 316, 322, 375/340, 342, 343, 346
See application file for complete search history.

(56) References Cited

U.S. PATENT DOCUMENTS 7,457,377 B2 * 11/2008 Wellig et al. .................. 375/343
(Continued)

OTHER PUBLICATIONS

Tanaka et al., "Simplified Correlation Decoding by Selecting Possible Codewords Using Erasure Information," IEEE Transactions on Information Theory, Sep. 1, 1983, pp. 743-748, vol. 29, No. 5.
Chase, "A Class of Algorithms for Decoding Block Codes With Channel Measurement Information," IEEE Transactions on Information Theory, Jan. 1, 1972, pp. 170-182, vol. 18, No. 1.

(Continued)

*Primary Examiner* — Hirdepal Singh
(74) *Attorney, Agent, or Firm* — Fulbright & Jaworski LLP (57) ABSTRACT

A method of receiving a demodulated waveform according to a protocol in which the waveform represents a block of transmitted bits comprising a first group of bits and a second group of bits, the second group of bits being a function of the first group of bits, the method comprising: sampling the demodulated waveform to recover a first group of sample values corresponding to the first group of transmitted bits and a second group of sample values corresponding to the second group of transmitted bits; assigning bit values to reliable sample values of the first group of sample values; generating a set of candidates for a block of bits corresponding to the demodulated waveform, each candidate comprising a first group of candidate bits and a second group of candidate bits, the first group of candidate bits being generated using the assigned bit values and a combination of bit values unique to that candidate in the set of candidates, and the second group of candidate bits being generated by applying the said function to the first group of candidate bits; performing a correlation operation by determining a correlation between each candidate and the recovered first and second groups of sample values to form a correlation value associated with each candidate; and selecting the candidate associated with the correlation value that is indicative of the strongest degree of correlation between a candidate and the first and second groups of sample values to be the block of bits corresponding to the demodulated waveform.

24 Claims, 3 Drawing Sheets

(56) References Cited

U.S. PATENT DOCUMENTS

| | | | |
|---|---|---|---|
| 7,512,861 B2* | 3/2009 | Brajovic | 706/20 |
| 2009/0180525 A1* | 7/2009 | Kobayashi et al. | 375/150 |
| 2009/0249165 A1* | 10/2009 | Gracie et al. | 714/758 |
| 2010/0080326 A1* | 4/2010 | Taipale et al. | 375/340 |
| 2012/0038832 A1* | 2/2012 | Kim et al. | 348/723 |

OTHER PUBLICATIONS

Kaneko et al., "An Efficient Maximum-Likelihood-Decoding Algorithm For Linear Block Codes With Algebraic Decoder," IEEE Transactions on Information Theory, Mar. 1, 1994, pp. 320-327, vol. 40, No. 2.

Forney, "Generalized Minimum Distance Decoding," IEEE Transactions on Information Theory, Apr. 1, 1966, pp. 125-131, vol. IT-12.

* cited by examiner

SIGNAL RECEPTION

FIELD OF THE INVENTION

This invention relates to receiving a demodulated waveform, in particular to determining a block of bits corresponding to the demodulated waveform. The present invention is particularly applicable to receiving a waveform according to a protocol in which the waveform represents a block of transmitted bits in which some of the bits are a function of other of the bits.

BACKGROUND OF THE INVENTION

RDS (Radio Data System) and RBDS (Radio Broadcast Data System) are communications protocols for embedding data in FM (frequency modulated) analogue broadcasts. RDS and RBDS bit streams have a common organisational structure. They have a bit rate of 1187.5 bits per second. Each bit stream is organised into groups, each group consisting of 4 blocks. Each block is assigned a block type from block types A, B, C, C', D and E. For RDS, the first block of a group is A, the second block is of type B, the third is of type C or C', the fourth is of type D. In RBDS some blocks may have type E. Each block consists of 26 bits including 16 information bits and 10 parity bits. The information bits comprise the embedded data. The parity bits are derived from the information bits by combining the information bits with a generator sequence (often referred to as a shortened cyclic code) and one of a selection of 10 bit words defined by the RDS/RBDS protocol. This derivation may be carried out as follows.

The information bits (expressed as a 1×16 matrix) are multiplied by a matrix known as the generator matrix G. Matrix G is a 26×16 matrix derived from the generator polynomial:

$$g(x)=x^{10}+x^8+x^7+x^5+x^4+x^3+1 \qquad \text{(equation 1)}$$

The multiplication results in a 26×1 matrix, the first 16 terms of which are the 16 information bits. The remaining 10 terms are XORed with one of a selection of 10 bit words (offset words) defined by the RDS/RBDS protocol. Six offset words are defined at present, each associated with a respective block type. Accordingly, the remaining 10 terms are XORed with the offset word associated with the block type of the block being generated. The 10 bits resulting from the XOR operation are the parity bits.

The function relating the parity bits to the information bits is known to the receiving end of the transmission. The consequent redundancy in the decoded embedded data can be used by the receiver to detect errors and/or correct errors in the data.

The RDS and RBDS protocols use the same error correction code. A standard way of implementing error correction for the received data is to decode the data based on known properties of the shortened cyclic code used to generate the parity bits. For example the April 1998 RBDS standard describes using an error-trapping decoder that operates by performing a bit-by-bit recovery of the encoded bits from the demodulated waveform, followed by decoding of the encoded bits so as to minimise the Hamming distance between the received bits and the estimated transmitted bits, the estimated transmitted bits having been determined based on known properties of the shortened cyclic code.

Figure 1:
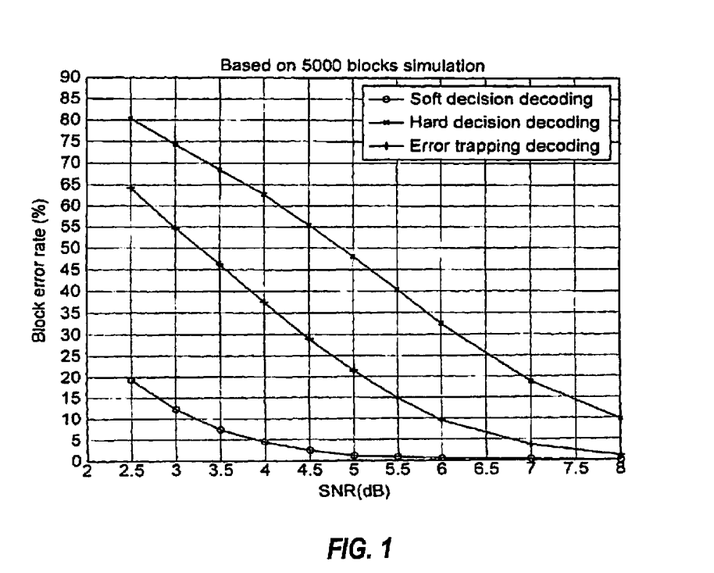
FIG. 1 is a graph comparing the performance of three decoding methods.

The performance of a decoding technique can be measured in terms of the percentage of blocks that are received with one or more errors. FIG. 1 shows the block decoding performance of the error-trapping decoder method as a function of the signal to noise ratio (SNR) of the received signal. FIG. 1 also shows the block decoding performance of hard-decision decoding. Hard-decision decoding is when the received demodulated waveform is recovered and decoded on a bit-by-bit basis with no error correction. FIG. 1 shows that error-trapping decoding performs significantly better than hard-decision decoding over the SNR range measured. However error-trapping decoding still performs poorly at low SNR. The percentage block error rate for error-trapping decoding exceeds 25% once the SNR has dropped to 4.5 dB, and exceeds 50% once the SNR has dropped to 3 dB.

There is thus a need for an improved method of decoding a received RDS/RBDS signal that increases receiver sensitivity.

SUMMARY OF THE INVENTION

According to a first aspect of the present invention there is provided a method of receiving a demodulated waveform according to a protocol in which the waveform represents a block of transmitted bits comprising a first group of bits and a second group of bits, the second group of bits being a function of the first group of bits, the method comprising: sampling the demodulated waveform to recover a first group of sample values corresponding to the first group of transmitted bits and a second group of sample values corresponding to the second group of transmitted bits; assigning bit values to reliable sample values of the first group of sample values; generating a set of candidates for a block of bits corresponding to the demodulated waveform, each candidate comprising a first group of candidate bits and a second group of candidate bits, the first group of candidate bits being generated using the assigned bit values and a combination of bit values unique to that candidate in the set of candidates, and the second group of candidate bits being generated by applying the said function to the first group of candidate bits; performing a correlation operation by determining a correlation between each candidate and the recovered first and second groups of sample values to form a correlation value associated with each candidate; and selecting the candidate associated with the correlation value that is indicative of the strongest degree of correlation between a candidate and the first and second groups of sample values to be the block of bits corresponding to the demodulated waveform.

Preferably, the method further comprises decoding the block of bits corresponding to the demodulated waveform according to the said protocol.

Suitably, the method further comprises sorting the first group of sample values in order of their absolute values, and selecting the sample values with the highest absolute values to be the reliable sample values.

Suitably, the method further comprises determining a number of sample values to be selected as reliable in dependence on the signal to noise ratio of the received signal such that the number of sample values to be selected as reliable increases as the signal to noise ratio of the received signal increases.

Suitably, the correlating step comprises cross correlating each candidate with the recovered first and second groups of sample values, and the selecting step comprises selecting the candidate with the highest cross correlation value, the highest cross correlation value being the correlation value that is indicative of the strongest degree of correlation between a candidate and the first and second groups of sample values.

Suitably, the method comprises comparing the correlation value of the selected candidate with the sum of the absolute values of the first and second groups of sample values, and estimating a likelihood that the selected candidate is identical to the block of transmitted bits in dependence on this comparison.

Suitably, the method further comprises estimating the likelihood to be high if the difference between the correlation value of the selected candidate and the sum of the absolute values of the first and second groups of sample values is low.

Suitably, performing the correlation operation comprises: estimating a signal power associated with the first and second groups of sample values; and forming replacement candidates from each of the candidates in the candidate set by replacing each candidate bit having a first bit value with a bit having a first replacement value, and replacing each candidate bit having a second bit value with a bit having a second replacement value, the first and second replacement values being dependent on the estimated signal power.

Suitably, performing the correlation operation further comprises: for each replacement candidate formed from the candidates in the candidate set, determining the Euclidean distance between a first vector comprising the bits of the replacement candidate and a second vector comprising the first and second groups of sample values; and wherein selecting the candidate associated with the correlation value indicative of the strongest degree of correlation between a candidate and the first and second groups of sample values comprises selecting the candidate from which the replacement candidate yielding the smallest Euclidean distance was formed.

Suitably, performing the correlation operation further comprises: for each replacement candidate formed from the candidates in the candidate set, determining the Hamming distance between a first vector comprising the bits of the replacement candidate and a second vector comprising the first and second groups of sample values; and wherein selecting the candidate associated with the correlation value indicative of the strongest degree of correlation between a candidate and the first and second groups of sample values comprises selecting the candidate from which the replacement candidate yielding the smallest Hamming distance was formed.

Suitably, the method comprises generating the set of candidates by forming a candidate vector in which the assigned bit values occupy the same positions within the first group of candidate bits as the reliable sample values occupied within the first group of sample values.

Suitably, the protocol is a RDS (radio data system) protocol or a RBDS (radio broadcast data system) protocol, and wherein the first group of transmitted bits comprises information bits and the second group of transmitted bits comprises parity bits.

Suitably, the demodulated waveform is received according to a protocol in which the waveform represents a block of transmitted bits within a stream of transmitted bits, said block of transmitted bits commencing at a bit position in said stream of bits that is unknown to a receiver, the method comprising synchronising the receiver to that bit position by: sampling the demodulated waveform such that, for each bit position at which the block of transmitted bits could have commenced, a first group of sample values is recovered that would correspond to the first group of transmitted bits if the block of transmitted bits had commenced at that bit position and a second group of sample values is recovered that would correspond to the second group of transmitted bits if the block of transmitted bits had commenced at said bit position, and generating a respective set of candidates from that first group of sample values; performing a correlation operation, for each bit position, by determining a correlation between each candidate in the respective set of candidates corresponding to that bit position and the respective first and second groups of sample values corresponding to that bit position to form a respective correlation value associated with each candidate at that bit position; and synchronising the receiver to the bit position corresponding to the candidate associated with the correlation value indicative of the strongest degree of correlation between the candidate and the recovered first and second groups of sample values.

Suitably, the protocol according to which the demodulated waveform is received is such that the function by which the second group of bits is derived from the first group of bits is one of a plurality of functions defined by the protocol, the method comprising determining which of said plurality of functions was applied to the first group of transmitted bits by: generating, for each of the functions defined by the protocol, a set of candidates in which the second group of candidate bits in each candidate is generated by applying said function to the first group of candidate bits; and determining the function applied to the first group of transmitted bits to be the function by means of which the candidate that is associated with the correlation value that is indicative of the strongest degree of correlation between a candidate and the first and second groups of sample values was generated.

Suitably, the waveform represents a plurality of blocks of transmitted bits, each comprising a respective first group of bits and a respective second group of bits that is a function of the respective first group of bits, the plurality of blocks of transmitted bits having formed part of a stream of transmitted bits and having commenced at a bit position in said stream of bits that is unknown to a receiver, the method comprising: for each block of transmitted bits, sampling the demodulated waveform such that, for each bit position at which that block of transmitted bits could have commenced, a first group of sample values is recovered that would correspond to the first group of transmitted bits if the block of transmitted bits had commenced at that bit position and a second group of sample values is recovered that would correspond to the second group of transmitted bits if the block of transmitted bits had commenced at said bit position.

Suitably, the demodulated waveform is further received according to a protocol such that for each block of transmitted bits the function by which the respective second group of bits comprised in that block of transmitted bits is derived from the respective first group of bits is one of a plurality of functions defined by the protocol, the method comprising: for each block of transmitted bits, each function defined by the protocol and each of the first and second groups of sample values associated with a respective bit position at which the block of transmitted bits could have commenced, generating a set of candidates by applying that function to each first group of candidate bits formed from the first group of sample values associated with that respective bit position to generate a respective second group of candidate bits.

Suitably, the method comprises performing the correlation operation by determining a correlation between each candidate comprising a first group of candidate bits formed from a first group of sample values associated with a respective bit position and the recovered first and second groups of sample values associated with that respective bit position to form a correlation value associated with that candidate.

Suitably the method comprises, for each set of candidates, selecting the candidate associated with the correlation value that is indicative of the strongest degree of correlation between a candidate and its corresponding first and second groups of sample values.

Suitably, the method comprises determining a likelihood of a specific one of the plurality of functions having been used in forming a block of transmitted bits by performing an integration operation on correlation values associated with different blocks of transmitted data.

Suitably, the method comprises determining a likelihood of a block of transmitted bits having commenced at a specific bit position by performing an integration operation on correlation values associated with different blocks of transmitted data.

Suitably, the method comprises performing the integration operation on the correlation values that are associated with the selected candidate from each candidate set formed using a specific one of the plurality of functions and a specific commencement bit position so as to form a likelihood, for each block of transmitted bits, that a specific combination of function and commencement bit position was used to form that block of transmitted bits.

Suitably, the method comprises summing combined likelihoods associated with specific ones of the functions and specific ones of the blocks of transmitted data bits to form function likelihoods indicative of a likelihood that specific ones of the blocks of transmitted data bits were formed using specific ones of the functions and selecting as the function most likely to have been used to form a block of transmitted bits the function corresponding to the highest function likelihood associated with that block of transmitted data bits.

Suitably, the method comprises, for each block of transmitted data bits, selecting as the bit position at which the block of transmitted data bits is most likely to have commenced the bit position corresponding to the likelihood having the highest value that is associated with the function determined to be the function most likely to have been used to form that block of transmitted bits.

According to a second aspect of the present invention, there is provided an apparatus configured to receive a demodulated waveform according to a protocol in which the waveform represents a block of transmitted bits comprising a first group of bits and a second group of bits, the second group of bits being a function of the first group of bits, the apparatus comprising: a sampling module configured to sample the received demodulated waveform to recover a first group of sample values corresponding to the first group of transmitted bits and a second group of sample values corresponding to the second group of transmitted bits; a reliability module configured to assign bit values to reliable sample values of the first group of sample values; a candidate word generator configured to generate a set of candidates for a block of bits corresponding to the received demodulated waveform, each candidate comprising a first group of candidate bits and a second group of candidate bits, the first group of candidate bits being generated using the assigned bit values and a combination of bit values unique to that candidate in the set of candidates, and the second group of candidate bits being generated by applying the said function to the first group of candidate bits; and a correlator configured to perform a correlation operation by determining a correlation between each candidate and the recovered first and second groups of sample values to form a correlation value associated with each candidate; wherein the candidate word generator is further configured to select the candidate associated with the correlation value that is indicative of the strongest degree of correlation between a candidate and the first and second groups of sample values to be the block of bits corresponding to the received demodulated waveform.

BRIEF DESCRIPTION OF THE DRAWINGS

The present invention will now be described by way of example with reference to the accompanying drawings. In the drawings.

DESCRIPTION OF THE PREFERRED EMBODIMENTS

Figure 2:
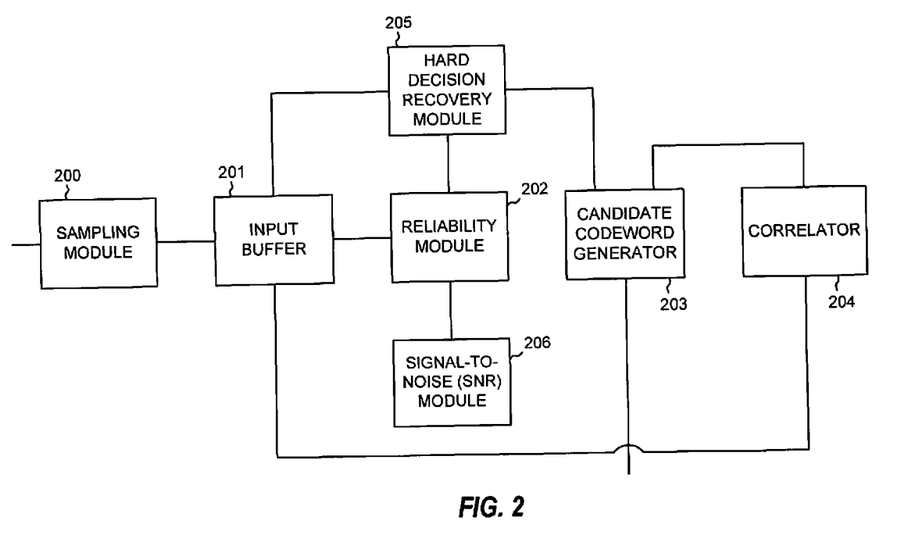
FIG. 2 is a schematic diagram of the general arrangement of a decoding apparatus.

FIG. 2 shows a schematic diagram of the general arrangement of a decoding apparatus.

The decoding apparatus comprises a sampling module 200. The received encoded demodulated waveform is input to the sampling module. A first output of the sampling module 200 is connected to an input of a buffer 201. A first output of the buffer 201 is connected to an input of a reliability module 202. A second output of the buffer 201 is connected to an input of a hard-decision recovery module 205. An output of a signal to noise ratio (SNR) module 206 is connected to a second input of the reliability module 202. An output of the reliability module is connected to a second input of the hard-decision recovery module 205. An output of the hard-decision recovery module 205 is connected to a first input of a candidate codeword generator 203. A first output of the candidate word generator is connected to a first input of a correlator 204. A third output of the buffer 201 is connected to a second input of the correlator 204. An output of the correlator is connected to a second input of the candidate word generator 203. A second output of the candidate word generator 203 forms the output of the decoding apparatus.

In operation, signals are decoded and corrected for errors by the decoding apparatus of FIG. 2. The sampling module 200 receives the demodulated RDS/RBDS waveform (at base-band frequency) representing an encoded block of transmitted bits. The sampling module 200 samples the waveform at times estimated so as to maximise the probability of correct detection. For example the sampling times may correspond to the middle of the received symbols. For an RDS/RBDS block, the sampling module samples the waveform 26 times resulting in 26 sample values of the demodulated waveform. The sampling module outputs the sample values to the buffer 201. The buffer stores these 26 sample values (denoted $w_1$, $w_2$, ... $w_{25}$, $w_{26}$). The buffer also stores the last sample value ($w_0$) from the previous waveform representing the previous block of transmitted bits. This sample value can be used to decode the current block as follows.

The RDS and RBDS protocols use differential encoding and decoding. Differential encoding is employed such that each current encoded bit is the XOR result of the previous encoded bit and the current bit before encoding. This can be expressed as:

$$e(m)=e(m-1)XORu(m) \quad \text{(equation 2)}$$

where $e(m)$ is the $m^{th}$ encoded bit, and $u(m)$ is the $m^{th}$ unencoded bit.

Similarly, differential decoding is employed such that each current decoded bit is the XOR result of the previous encoded bit and the current encoded bit. This can be expressed as:

$$d(m)=e(m-1)XORe(m) \quad \text{(equation 3)}$$

where $d(m)$ is the $m^{th}$ decoded bit.

Consequently, 27 consecutive encoded bits (one being the last bit from the previous block) are required to decode a 26 bit block.

The first 17 sample values in the buffer 201 (corresponding to the 16 transmitted information bits) are outputted to the reliability module 202. The reliability module assesses these 17 sample values to estimate which of their corresponding hard-decision recovered bits are the most reliable hard-decision recovered bits of the block and which the most unreliable. It is not necessary to carry out the hard-decision recovery in order to assess the reliability of the hard-decision decoded bits. One way to assess the reliability of the hard-decision decoded bits is as follows. The reliability module 202 sorts the first 17 sample values in ascending order of their absolute values. The 17 sample values can be denoted:

$$w_k (k=0, 1 \ldots, 16)$$

and the sorting index can be denoted:

$$I_k (k=0, 1 \ldots, 16)$$

wherein $I_k=0$ corresponds to the least reliable bit, $I_k=1$ corresponds to the second least reliable bit and so on.

The reliability module determines that hard-decision recovered bits corresponding to sample values with $I_k<K_{dec}$ are unreliable and hard-decision recovered bits corresponding to sample values with $I_k \geq K_{dec}$ are reliable.

Preferably, Kdec is dynamically determined based on the quality, or SNR, of the received signal. Considering a model for the demodulated sample values consisting of ideal bits with magnitude B plus zero-mean noise of power P, the SNR of the received signal is defined as $10 \log_{10}(B^2/P)$. Other definitions of SNR may be equally suitable. The SNR module 206 outputs the SNR to the reliability module 202. The reliability module 202 varies Kdec such that an increase in the SNR leads to a smaller Kdec and a decrease in SNR leads to a higher Kdec. Alternatively, Kdec may be dynamically determined based on other properties of the channel. As a further alternative, Kdec may be determined prior to reception of the signal and remain constant throughout reception of the signal.

The reliability module 202 outputs the indices of the reliable (17-Kdec) values to the hard-decision recovery module 205. The hard-decision recovery module 205 extracts the reliable sample values from the buffer 201 and hard-decision recovers them. Alternatively, the hard-decision recovery module may extract and hard-decision recover all the sample values from the buffer, preferably prior to receiving the reliable (17-Kdec) values from the reliability module 202. In either implementation, the hard-decision recovery module 205 outputs the reliable hard-decision recovered bits to the candidate codeword generator 203.

The candidate codeword generator 203 generates a set of candidate codewords for a block of bits corresponding to the encoded demodulated waveform. Each of these candidate codewords comprises 27 bits including 17 information bits and 10 parity bits. The candidate codeword generator 203 assigns the reliable hard-decision recovered bits to respective bit positions of the encoded information bits in each of the candidate words that it generates. The candidate codeword generator varies the remaining bits of the information bits from candidate codeword to candidate codeword such that a candidate codeword is generated for each possible recovered combination of the remaining bits. Preferably, the combination of bits used for the remaining information bits of each candidate codeword is unique to that candidate in the set of candidates. The number of distinct candidate codewords is $2^{Kdec}$.

Each candidate codeword is assigned a group of Kdec bits to be used as the remaining bits of the information bits. For the $n^{th}$ candidate codeword these remaining bits, denoted B(n), can be expressed as:

$$B(n)=b_{Kdec-1}b_{Kdec-2} \ldots b_0 (n=0, 1 \ldots 2^{Kdec}-1) \quad \text{(equation 4)}$$

The encoded information bits of the candidate codeword can be expressed as:

$$E(n)=C_0^n C_1^n \ldots C_{16}^n \quad \text{(equation 5)}$$

If
$0 \leq k < 17$ and $I_k < K_{dec}$
then $$C_k^n = b_{I_k} \quad \text{(equation 6)}$$

otherwise $$C_k^n = 1 \text{ if } w_k > 0, 0 \text{ otherwise} \quad \text{(equation 7)}$$

For example if Kdec=11 and n=0
$B(0)=b_{10} b_9 b_8 b_7 b_6 b_5 b_4 b_3 b_2 b_1 b_0$
and $w_k$ in ascending order of reliability are
$w_3 \ w_{16} \ w_1 \ w_7 \ w_8 \ w_9 \ w_4 \ w_2 \ w_{13} \ w_6 \ w_5 \ w_{11} \ w_{15} \ w_{14} \ w_0 \ w_{10}$
then
$I_3=0, I_{16}=1, I_1=2 \ldots I_0=15, I_{10}=16$
For the first information bit, $C_0^0$
k=0
$I_0=15$ and $15 \geq 11$ i.e. $I_k \geq K_{dec}$ for k=0
Therefore:
$C_0^0 = 1$ if $w_0 > 0$, 0 otherwise
For the second information bit, $C_1^0$
k=1
$I_1=2$ and $2<11$ i.e. $I_k < K_{dec}$ for k=1
Therefore:
$C_1^0 = b_{I_1} = b_2$
If, for example,
$B(0)=10011100101$
Then
$C_1^0 = 1$ The 17 encoded information bits of each candidate codeword are differentially decoded to obtain the 16 corresponding decoded information bits:

$$D(n)=d_0^n d_1^n \ldots d_{15}^n \text{ wherein } d_k^n = c_k^n \text{XOR} c_{k+1}^n \quad \text{(equation 8)}$$

The candidate codeword generator 203 determines the unencoded parity bits from the 16 decoded information bits using the method described in the background to this invention. Note that an offset word depending on block type is used in determining the parity bits. The resulting 10 unencoded parity bits can be denoted:

$$p_0^n p_1^n \ldots p_9^n$$

These unencoded parity bits are then differentially encoded to form the 10 encoded parity bits denoted:

$$q_0^n q_1^n \ldots q_9^n$$

wherein $d_{15}^n$ is used to form $q_0^n$.

The 17 encoded information bits and 10 encoded parity bits form the candidate codeword T(n):

$$T(n)=C_0^n C_1^n \ldots C_{16}^n p_0^n p_1^n \ldots p_9^n (n=0, 1 \ldots 2^{Kdec}-1) \quad \text{(equation 9)}$$

More generally, hard decision procedures other than equation 7 may be more suitable, depending on the characteristics of the modulation and on the demodulation processing applied to the signal prior to decoding. For example, the waveform may have negative polarity, so that negative values of $w_k$ are decoded as a '1' bit and positive values as a '0' bit. In another example, each demodulated symbol may convey more than one bit of information. The procedure described above can be straightforwardly amended to generate candidate codewords in these cases.

The candidate codeword generator 203 outputs the $2^{Kdec}-1$ candidate codewords to the correlator 204. The correlator correlates each candidate codeword with the sample values stored in the buffer 201. Suitably, for each candidate codeword, the correlator cross correlates each bit of the candidate codeword with its respective sample value. The cross correlation value for the $n^{th}$ candidate codeword X(n) can be expressed mathematically as follows:

$$X(n) = \left[2\sum_{k=0}^{16}(C_k^n - 0.5) \times w_k\right] + \left[2\sum_{k=0}^{9}(p_k^n - 0.5) \times w_{k+17}\right] \quad \text{(equation 10)}$$

The candidate codeword yielding the strongest degree of correlation is selected to correspond to the encoded block of bits represented by the demodulated waveform. In this case, the strongest degree of correlation is indicated by the largest cross correlation value. This is because the larger the cross correlation value, the closer the candidate codeword is to the sample values and hence the more likely it is that the candidate codeword corresponds to the transmitted block of bits. The identity of this selected candidate codeword is outputted by the correlator 204 to the candidate codeword generator 203. Alternatively, the correlator may use any other suitable cross correlation method.

The candidate codeword generator 203 has previously decoded the information bits of the selected candidate. It retrieves these decoded candidate information bits and outputs them from the decoding apparatus as the decoded information bits of the demodulated waveform. Alternatively, if the decoded information bits are not stored in the candidate codeword generator 203 then the correlator 204 or the candidate codeword generator can decode the encoded candidate codeword selected by the correlator and output the decoded information bits from the decoding apparatus.

Hard-decision decoding decodes all sample values with absolute values greater than a certain value (for example 0) to represent a transmitted bit with bit value 1, and all other sample values to represent a transmitted bit with bit value 0. The principle behind the described method is to use hard-decision decoding for the most reliable sample values of a group of sample values representing the information bits and for the remaining less reliable sample values to try all possible decoding combinations. Reliable sample values are those with larger absolute values. A number of candidate codewords are generated, each comprising a different one of the possible combinations for the unreliable sample values. The candidate codewords are correlated against the recovered sample values. The candidate codeword best correlated with the recovered sample values is chosen to be the block of bits corresponding to the demodulated waveform. The selected candidate codeword is then decoded.

The "soft-decision decoding" of the described method is more accurate than hard-decision decoding and the error-trapping method described in the background to this invention for the following reasons. The cross-correlation method is equivalent to finding the codeword closest to the received waveform, based on Euclidean distance, and is optimum under certain assumptions about how the received waveform differs from the transmitted codeword. For example, assuming that the received waveform is equal to the transmitted one plus additive white Gaussian noise, minimum distance decoding maximises the likelihood of correct detection.

The parity bits of an RDS/RBDS block are generated from the information bits. This means that the embedded data in a block can be determined by decoding either the parity bits of the block or the information bits of the block. The method described herein takes advantage of this redundancy by initially using only the information bits to decode the block. The parity bits for each candidate codeword are generated from the decoded information bits for that candidate codeword. Each candidate codeword is then correlated against the recovered sample values including the recovered sample values representing the parity bits (these sample values are not used in generating the candidate codewords). Errors in the candidate codeword can be deduced by the value of the correlation between the parity bits as determined by the decoded information bits and the parity sample values. By correlating the candidate codeword against the recovered sample values rather than hard-decision recovered bits, the method described herein improves the accuracy of the correlation. The absolute values of the recovered sample values are discarded by the hard-decision and error-trapping decoding methods. Additionally, by correlating a plurality of candidate codewords with the sample values, these candidate codewords covering all possible combinations for the information bits that are considered to be unreliable, it is more likely that the correct information bits will be recovered than when using hard-decision decoding or error-trapping decoding. Errors in the decoding method described herein are minimised by selecting the candidate codeword most highly correlated with the recovered sample values.

In the background to this invention, the information bits are expressed as a 1×16 matrix, in other words a vector with 16 terms. Similarly, each candidate codeword can be expressed as a vector with 27 terms, and each set of 27 sample values stored in the buffer 201 can be expressed as a vector with 27 terms. The dot product, or scalar product, of two vectors a and b is given by:

$$a \cdot b = |a||b|\cos\theta \quad \text{(equation 11)}$$

where θ is the angle between the vectors.

The lengths of the vectors representing the different candidate codewords are the same, therefore the moduli of the vectors representing the different candidate codewords are the same. The dot product between the sample value vector and a candidate codeword vector varies from candidate codeword vector to candidate codeword vector because the angle θ varies. The closest match between the sample value vector and the candidate codeword vectors is consequently found when the angle θ is minimised. When θ is zero the vectors are coincident in direction. θ is minimised when cos θ is maximised. The cross-correlation calculation carried out in the method described is equivalent to evaluating the dot product of the sample value vector and a candidate codeword vector. Since the moduli of the vectors are fixed for a given set of sample values, when the cross correlation value X is maximised, the angle θ is minimised. The candidate codeword with the highest correlation value X is therefore the closest match to the sample values. The decoded information bits of the candidate codeword with the highest correlation value are therefore considered to be the most likely unencoded transmitted bits and are outputted as such from the decoding apparatus of FIG. 2.

The reliability of the information bits outputted from the decoding apparatus of FIG. 2 is estimated at the correlator 204. Correlator 204 comprises a summation module that sums the absolute values of the 27 sample values stored in the buffer 201. This summation can be denoted:

$$\sum_{k=0}^{26} |w_k| \quad \text{(equation 12)}$$

The correlator compares the maximum correlation value, Xmax, with this summation. The closer the maximum correlation value and the summation are, the more reliable the decoding result is.

An alternative method (to the cross correlation method) of calculating the minimum distance between a candidate codeword vector and the sample value vector will now be described with reference to FIG. 5. The modules common to both FIG. 2 and FIG. 5 have the same functionality unless specified otherwise in the following description. The reliability module 202 is additionally connected to a low pass filter 501. In an example implementation, the low pass filter 501 is a first order infinite impulse response (IIR) filter with a transfer function described by the Z-transform:

$$H(z) = \frac{\lambda}{1-(1-\lambda)z^{-1}}, \text{ where } 0 < \lambda < 1 \text{ is a constant} \quad \text{(equation 13)}$$

The absolute values of the sample values are outputted by the reliability module 202 to the low pass filter 501. The output of the low pass filter 501 is inputted to a power module 502. Power module 502 estimates the signal power of the sample values from the low pass filter output. The estimated sample value amplitude is denoted $\hat{r}$. The power module 502 outputs $\hat{r}$ to the candidate codeword generator 203. The candidate codeword generator 203 scales each candidate codeword vector by $\hat{r}$ by replacing each bit value of 1 by $\hat{r}$ and each bit value of 0 by $-\hat{r}$. For example, the candidate codeword vector:

T=(1 1 0 . . . )

is scaled to

T'=($\hat{r}$ $\hat{r}$ $-\hat{r}$ . . . )

The candidate codeword generator 203 outputs the scaled candidate codeword to a distance calculation module 503. The distance calculation module 503 calculates the Euclidean distance between the scaled candidate codeword vector and the vector of sample values. The Euclidean distance is given by:

$$T-w = \sqrt{(T_1-w_1)^2+(T_2-w_2)^2...+(T_{27}-w_{27})^2} \quad \text{(equation 14)}$$

wherein T is a scaled candidate codeword vector denoted $T=(T_1, T_2, \ldots T_{27})$ and w is the vector of sample values denoted $w=(w_1, w_2, \ldots w_{27})$.

The Euclidean distance is a measure of the strength of the correlation between a scaled candidate codeword and the vector of sample values. The smaller the Euclidean distance, the more closely the vectors correspond to each other, the stronger the degree of correlation between the vectors. Consequently, the scaled candidate codeword displaced by the smallest Euclidean distance to the vector of sample values is selected to be the encoded block of bits represented by the demodulated waveform.

Alternatively, the distance calculation module 503 calculates the Hamming distance between the scaled candidate codeword vectors and the vector of sample values, and selects the scaled candidate codeword with the smallest Hamming distance to the vector of sample values to be the encoded block of bits represented by the received demodulated waveform. In this case, the smaller the Hamming distance, the more closely the vectors correspond, the stronger the degree of correlation between them. Calculating the Hamming distance is less computationally complex than calculating the Euclidean distance so may be used in preference to using the Euclidean distance to reduce the computational complexity of the calculation.

A disadvantage of using either the Euclidean distance or the Hamming distance compared to the cross correlation method is that both of these distance calculations require estimation of the power of the demodulated sample values before they can be used. This is because the relative length of the two vectors is pertinent to a calculation of Euclidean distance or Hamming distance between the two vectors, whereas this is not relevant in the cross correlation method which instead depends on the angle between the two vectors. It takes some time for the estimation of the power of the demodulated sample values to become reliable. This time depends on the filter structure and the SNR of the received signal. There is therefore a time at the beginning of receipt of a signal during which the decoding apparatus produces an unreliable output. Conversely, the cross correlation method of determining the distance between the vectors does not require estimation of the received signal power and therefore does not suffer from this reliability problem. Additionally, the computational complexity of the cross correlation method is lower as a result.

The identity of the selected candidate codeword is outputted by the distance calculation module 503 to the candidate codeword generator 203.

The candidate codeword generator 203 has previously decoded the information bits of the selected candidate. It retrieves these information bits and outputs them from the decoding apparatus as the decoded information bits. Alternatively, if the decoded information bits are not stored in the candidate codeword generator 203 then the distance calculation module 503 or the candidate codeword generator can decode the encoded candidate codeword selected by the distance calculation module and output the decoded information bits from the decoding apparatus.

The performance of the method described herein increases as Kdec increases. The performance of the method is maximised when every possible candidate codeword is generated by generating all possible combinations of 17 bits, in other words when Kdec is 17. The computational complexity associated with such a method is very high since $2^{17}$ codewords are generated and analysed. To reduce the computational complexity, the described method generates $2^{Kdec}$ candidate codewords of the $2^{17}$ codewords by varying the least reliable Kdec bits and assigning hard-decision bit values to the most reliable (17-Kdec) bits.

The SNR of the received signal affects the performance of the method. The higher the SNR, the lower Kdec can be whilst achieving near full search performance. Full search performance is the optimal performance associated with generating and analysing all $2^{17}$ codewords. For SNR≥2 dB, when Kdec=12 the decoding performance degradation is negligible compared to full search performance. Advantageously, the computational intensity can be reduced at high SNR by reducing Kdec. Conversely, the performance can be increased at low SNR by increasing Kdec.

In FIG. 1 Kdec is 17.

The performance of a decoding technique can be measured in terms of the percentage of blocks that are received with one or more errors. FIG. 1 shows the block decoding performance of error-trapping decoding, hard-decision decoding, and the soft-decision decoding described herein, each as a function of the signal to noise ratio (SNR) of the received signal. FIG. 1 shows that soft-decision decoding performs significantly better than both hard-decision decoding and error-trapping decoding over the SNR range measured. Additionally, soft-decision decoding performs well at low SNR. The percentage block error rate for soft-decision decoding at 4.5 dB SNR is 2.5% compared to 29% for error-trapping decoding and 56% for hard-decision decoding. Even at 2.5 dB the error rate for soft-decision decoding is only 19% compared to 64% for error-trapping decoding and 81% for hard-decision decoding.

At startup (before block decoding) or after experiencing severe fading, the decoding apparatus of FIG. 2 needs to be synchronised. This synchronisation involves identifying the start of a received block of bits and identifying the block type of the received block. The above described method can advantageously be used in attaining synchronisation as follows.

Block types A, B, C, C', D and E are grouped into four categories corresponding to combinations NE (category 0), B/E (category 1), C/C'/E (category 2) and D/E (category 3). In some implementations detection of block type E is not required. In these implementations the four categories correspond to combinations A, B, C/C' and D respectively.

Synchronisation is based on the observation that RDS and RBDS data contains a known sequence of blocks which is repeated with a period of one group. Hence the maximum cross correlation value for each block type has peaks corresponding to blocks of received bits once per group (every 104 bits). It is possible to combine the maximum cross correlation values corresponding to a sequence of multiple consecutive sets of 26 received bits starting 26 bits apart. When the starting bit of the bit sets in this sequence is aligned to the starting bit of blocks in the received data and the block types in the sequence are aligned to the block types in the received data, the maximum cross correlation values add constructively.

Synchronisation profiles denoted:
$P^0(f)$, $P^1(f)$, $P^2(f)$ and $P^3(f)$ (f=0, 1, ... 25)
where f represents the starting bit position in a block of 26 bits, are defined for each of the four categories respectively as follows.

Synchronisation is initiated once there are 27 sample values in buffer 201. The method described in relation to the decoding apparatus of FIG. 2 is used to determine a maximum cross correlation value for each of the following cases: when the first sample value represents the first bit of a block and the block type is according to category 0, when the first sample value represents the first bit of a block and the block type is according to category 1, when the first sample value represents the first bit of a block and the block type is according to category 2, and when the first sample value represents the first bit of a block and the block type is according to category 3. Similarly, the method described in relation to the decoding apparatus of FIG. 2 is used to determine 4 maximum cross correlation values (for each of the 4 categories) for the case of each of the $2^{nd}$ to $26^{th}$ sample values representing the first bit of a block. These maximum cross correlation calculations are further carried out for each consecutive set of 26 sample values.

Figure 3:
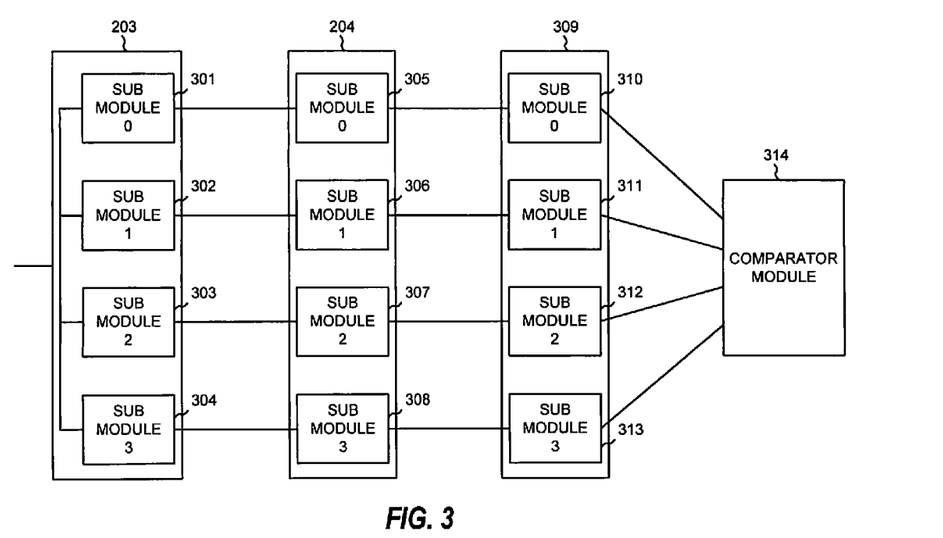
FIG. 3 is a schematic diagram of an example arrangement of a synchronisation apparatus.

When used in the synchronisation process, the candidate codeword generator 203 of FIG. 2 is further defined as shown in FIG. 3. The candidate codeword generator comprises 4 sub-modules: 301, 302, 303 and 304. Each sub-module receives the same information from the hard-decision recovery module as described in relation to FIG. 2. Sub-module 301 generates parity bits for each candidate codeword using the offset word associated with category 0. Similarly sub-modules 302, 303 and 304 generate parity bits for each candidate codeword using the offset words associated with categories 1, 2 and 3 respectively. In generating the candidate codewords, Ksync is used by the candidate codeword generator sub-modules instead of Kdec. Ksync is generally chosen to be smaller than Kdec to reduce the computational complexity of the synchronisation process.

The correlator 204 may also comprise 4 sub-modules 305, 306, 307 and 308, each sub-module receiving candidate codewords from one of the sub-modules of the candidate codeword generator. Sub-module 305 calculates cross-correlation values for each of the candidate codewords associated with category 0 that are outputted from sub-module 301 of the candidate codeword generator. Sub-modules 306, 307 and 308 operate similarly with respect to sub-modules 302, 303 and 304. The correlator sub-modules further determine the maximum cross correlation values for each group of candidate codewords associated with a particular block and first bit position.

The correlator sub-modules output the maximum cross correlation values to a profile module 309 (also sub-divided into four modules 310, 311, 312 and 313) which builds up synchronisation profiles for each category and starting bit position by integrating the maximum cross correlation values calculated for each category and starting bit position over the four blocks. This may be carried out, for example, by using a low pass filter. For each category, the $n^{th}$ integration step corresponding to the $n^{th}$ bit processed by the synchronisation module after its initialisation can be expressed as follows:

$$P_n^v(\mathrm{mod}(n, 26)) = \qquad \text{(equation 15)}$$
$$(1-\rho)P_{n-26}^v(\mathrm{mod}(n, 26)) + \rho Y_n^{mod\left(\left[\frac{mod(n,104)}{26}\right]+v,4\right)}$$

where v=0, 1, 2, 3, [x] is the largest integer less than or equal to x. $Y_n^v$ denotes the maximum cross correlation value determined by the correlator for the $v^{th}$ category (v=0, 1, 2, 3), for the block of received bits starting with bit n. $P_n^v(f)$ is the value of $P^v(f)$ after the $n^{th}$ integration step. $P^v(f)$ being the highest peak of all profiles indicates that it is estimated that the start of blocks of type v corresponds to received sample positions n such that mod(n, 104)=f.

As seen from equation 15, the integration procedure uses a filter described by the Z-transform:

$$H(z) = \frac{\rho}{1-(1-\rho)z^{-1}} \qquad \text{(equation 16)}$$

ρ determines the bandwidth of the filter used for integration. The smaller ρ is, the more smoothing is applied to build the synchronization profile. The following set of values is applied in an example implementation $$\rho = \begin{cases} 1 & 0 \le n < 26 \\ \frac{1}{2} & 26 \le n < 103 \\ \frac{1}{4} & 104 \le n < 208 \\ \frac{1}{8} & n \ge 208 \end{cases}$$

Other filters than that described by equation 16 may be equally suitable for the integration.

For example, $P_n^1$; (4) is the synchronisation profile for category 1 block type and bit position 4 (of the 26 bit positions) being the first bit of the block, after the $n^{th}$ integration step. This synchronisation profile is dependent on the maximum cross correlation values determined for bit position 4 being the first bit position and the signal being of category 1 block type.

Once per group, when mod(n, 104)=103, the profile module 309 outputs the synchronisation profiles to comparator module 314. Comparator module 314 calculates the maximum values of the synchronisation profiles for the 4 categories and the starting bit positions. The comparator module 314 compares these maximum values and selects the category with the maximum profile value to indicate the block type of the block. The comparator module further selects the starting bit position (of the selected category) with the maximum value to indicate the starting bit position of the block. The block type and starting bit position are outputted to a processor (not shown) to calibrate the apparatus preceding FIG. 2 in the receiver and the apparatus of FIG. 2.

The synchronisation scheme described is repeated for further blocks to achieve more reliable block synchronisation.

Figure 4:
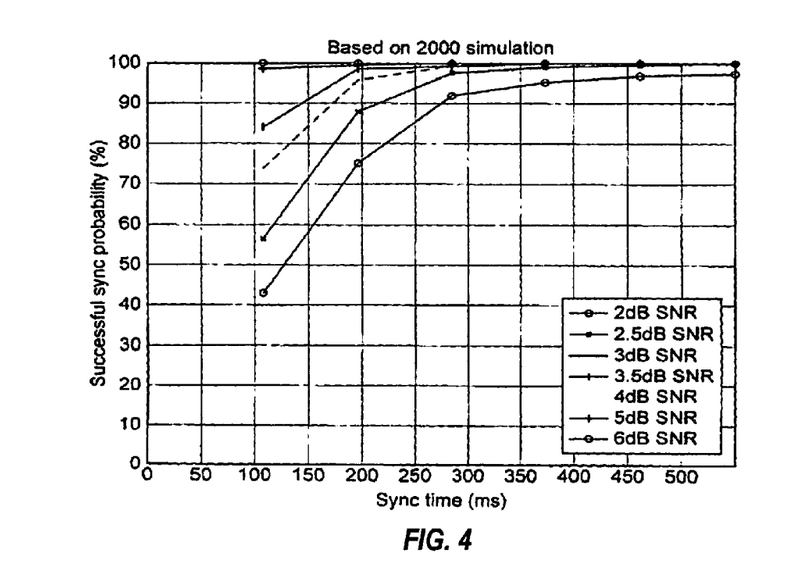
FIG. 4 is a graph comparing the performance of the synchronisation scheme.

The performance of a synchronisation scheme can be measured in terms of the percentage probability of successful synchronisation against synchronisation time. FIG. 4 shows the block synchronisation performance of the method described herein over a range of SNR values (each represented by a different curve). This data was obtained on the basis of 2000 simulations per (simulation time, SNR) pair. It can be seen that the time taken to achieve reliable synchronisation increases as the SNR decreases. For SNRs higher than 3 dB, reliable block synchronisation is reached after 2 groups of 4 blocks. For an SNR of 2 dB it takes 300 ms (almost 4 groups of 4 blocks) to achieve synchronisation with over 90% confidence.

The method described herein improves the sensitivity of an RDS receiver by using minimum distance decoding of the RDS error correction code. Synchronisation to RDS blocks and groups is also improved. The error correction and group synchronisation performed in this way afford an improvement in the RDS receiver sensitivity of about 2.7 dB compared to using hard-decision decoding and error-trapping decoding of the shortened cyclic code.

The methods and apparatus described herein are suitable for use with any protocol in which the transmitted bits comprise two groups, one group being derivable from the other group by the receiver.

Figure 5:
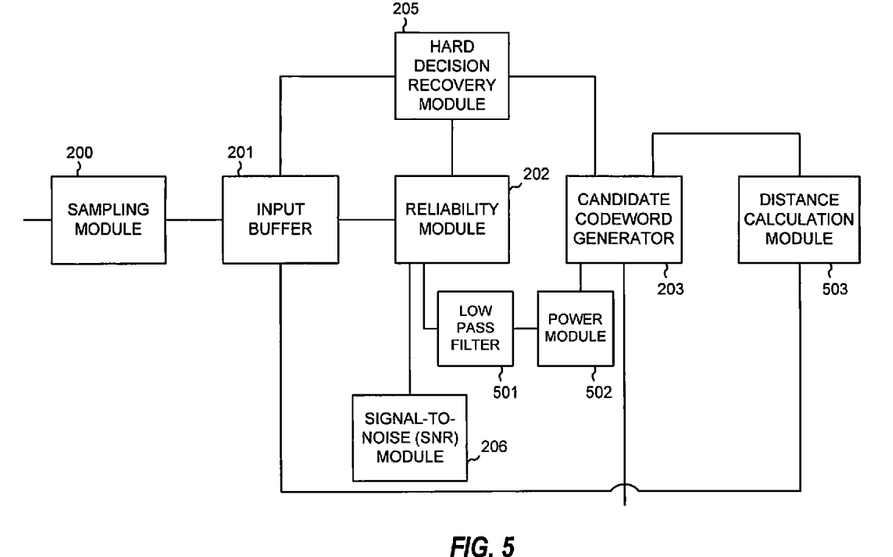
FIG. 5 is a schematic diagram of the general arrangement of an alternative decoding apparatus.

FIGS. 2, 3 and 5 are schematic diagrams of the decoding apparatus and synchronisation apparatus described herein. The methods described do not have to be implemented at the dedicated blocks depicted in any of these figures. The functionality of each block could be carried out by another one of the blocks described or using other apparatus. For example, the method described herein could be implemented partially or entirely in software.

Figure 6:
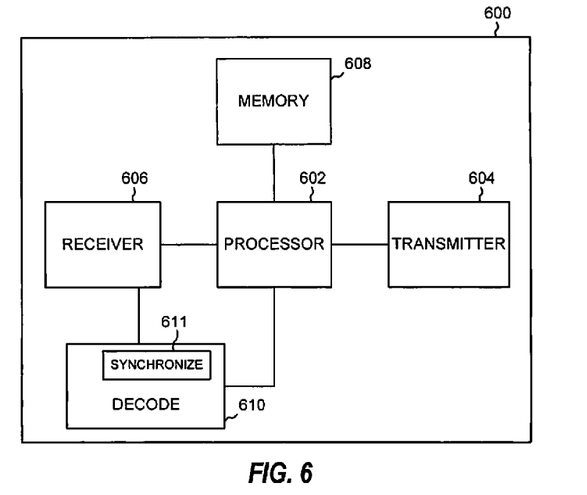
FIG. 6 is a schematic diagram of a transceiver suitable for comprising the apparatus of FIGS. 2, 3 and 5.

The decoding apparatus of FIG. 2 or 5 could usefully be implemented in a handheld transceiver. FIG. 6 illustrates such a transceiver 600. A processor 602 is connected to a transmitter 604, a receiver 606, a memory 608 and a decoding apparatus 610. Any suitable transmitter, receiver, memory and processor known to a person skilled in the art could be implemented in the transceiver. Preferably, the decoding apparatus 610 comprises the apparatus of FIG. 2 or FIG. 3. The decoding apparatus 610 may be modified by synchronisation apparatus 611. Synchronisation apparatus 611 comprises the apparatus of FIG. 5. The decoding apparatus is additionally connected to the receiver 606. The signals received and demodulated by the receiver may be passed directly to the decoding apparatus. Alternatively, the received signals may be stored in memory 608 before being passed to the decoding apparatus. The handheld transceiver of FIG. 6 could suitably be implemented as a wireless telecommunications device.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A method of receiving a demodulated waveform according to a protocol in which the waveform represents a block of transmitted bits comprising a first group of bits and a second group of bits, the second group of bits being a function of the first group of bits, the method comprising:
sampling the demodulated waveform to recover a first group of sample values corresponding to the first group of transmitted bits and a second group of sample values corresponding to the second group of transmitted bits;
assigning bit values to reliable sample values of the first group of sample values;
generating a set of candidates for a block of bits corresponding to the demodulated waveform, each candidate comprising a first group of candidate bits and a second group of candidate bits, the first group of candidate bits being generated using the assigned bit values and a combination of bit values unique to that candidate in the set of candidates, and the second group of candidate bits being generated by applying the said function to the first group of candidate bits;
performing a correlation operation by determining a correlation between each candidate and the recovered first and second groups of sample values to form a correlation value associated with each candidate; and
selecting the candidate associated with the correlation value that is indicative of the strongest degree of correlation between a candidate and the first and second groups of sample values to be the block of bits corresponding to the demodulated waveform.

2. A method as claimed in claim 1, further comprising decoding the block of bits corresponding to the demodulated waveform according to the said protocol.

3. A method as claimed in claim 1, further comprising sorting the first group of sample values in order of their absolute values, and selecting the sample values with the highest absolute values to be the reliable sample values.

4. A method as claimed in claim 1, further comprising determining a number of sample values to be selected as reliable in dependence on the signal to noise ratio of the received signal such that the number of sample values to be selected as reliable increases as the signal to noise ratio of the received signal increases.

5. A method as claimed in claim 1, comprising:
performing a correlation operation by cross correlating each candidate with the recovered first and second groups of sample values, and
selecting the candidate associated with the highest cross correlation value, the highest cross correlation value being the correlation value that is indicative of the strongest degree of correlation between a candidate and the first and second groups of sample values.

6. A method as claimed in claim 1, further comprising comparing the correlation value of the selected candidate with the sum of the absolute values of the first and second groups of sample values, and estimating a likelihood that the selected candidate is identical to the block of transmitted bits in dependence on this comparison.

7. A method as claimed in claim 6, further comprising estimating the likelihood to be high if the difference between the correlation value of the selected candidate and the sum of the absolute values of the first and second groups of sample values is low.

8. A method as claimed in claim 1, wherein performing the correlation operation comprises:
   estimating a signal power associated with the first and second groups of sample values; and
   forming replacement candidates from each of the candidates in the candidate set by replacing each candidate bit having a first bit value with a bit having a first replacement value, and replacing each candidate bit having a second bit value with a bit having a second replacement value, the first and second replacement values being dependent on the estimated signal power.

9. A method as claimed in claim 8, wherein performing the correlation operation further comprises:
   for each replacement candidate formed from the candidates in the candidate set, determining the Euclidean distance between a first vector comprising the bits of the replacement candidate and a second vector comprising the first and second groups of sample values; and
   wherein selecting the candidate associated with the correlation value indicative of the strongest degree of correlation between a candidate and the first and second groups of sample values comprises selecting the candidate from which the replacement candidate yielding the smallest Euclidean distance was formed.

10. A method as claimed in claim 8, wherein performing the correlation operation further comprises:
    for each replacement candidate formed from the candidates in the candidate set, determining the Hamming distance between a first vector comprising the bits of the replacement candidate and a second vector comprising the first and second groups of sample values; and
    wherein selecting the candidate associated with the correlation value indicative of the strongest degree of correlation between a candidate and the first and second groups of sample values comprises selecting the candidate from which the replacement candidate yielding the smallest Hamming distance was formed.

11. A method as claimed in claim 1, comprising generating the set of candidates by forming a candidate vector in which the assigned bit values occupy the same positions within the first group of candidate bits as the reliable sample values occupied within the first group of sample values.

12. A method as claimed in claim 1 wherein the protocol is a RDS (radio data system) protocol or a RBDS (radio broadcast data system) protocol, and wherein the first group of transmitted bits comprises information bits and the second group of transmitted bits comprises parity bits.

13. A method as claimed in claim 1, wherein the demodulated waveform is received according to a protocol in which the waveform represents a block of transmitted bits within a stream of transmitted bits, said block of transmitted bits commencing at a bit position in said stream of bits that is unknown to a receiver, the method comprising synchronizing the receiver to that bit position by:
    sampling the demodulated waveform such that, for each bit position at which the block of transmitted bits could have commenced, a first group of sample values is recovered that would correspond to the first group of transmitted bits if the block of transmitted bits had commenced at that bit position and a second group of sample values is recovered that would correspond to the second group of transmitted bits if the block of transmitted bits had commenced at said bit position, and generating a respective set of candidates from that first group of sample values;
    performing a correlation operation, for each bit position, by determining a correlation between each candidate in the respective set of candidates corresponding to that bit position and the respective first and second groups of sample values corresponding to that bit position to form a respective correlation value associated with each candidate at that bit position; and
    synchronizing the receiver to the bit position corresponding to the candidate associated with the correlation value indicative of the strongest degree of correlation between the candidate and the recovered first and second groups of sample values.

14. A method as claimed in claim 1, wherein the protocol according to which the demodulated waveform is received is such that the function by which the second group of bits is derived from the first group of bits is one of a plurality of functions defined by the protocol, the method comprising determining which of said plurality of functions was applied to the first group of transmitted bits by:
    generating, for each of the functions defined by the protocol, a set of candidates in which the second group of candidate bits in each candidate is generated by applying said function to the first group of candidate bits; and
    determining the function applied to the first group of transmitted bits to be the function by means of which the candidate that is associated with the correlation value that is indicative of the strongest degree of correlation between a candidate and the first and second groups of sample values was generated.

15. A method as claimed in claim 1, wherein the waveform represents a plurality of blocks of transmitted bits, each comprising a respective first group of bits and a respective second group of bits that is a function of the respective first group of bits, the plurality of blocks of transmitted bits having formed part of a stream of transmitted bits and having commenced at a bit position in said stream of bits that is unknown to a receiver, the method comprising:
    for each block of transmitted bits, sampling the demodulated waveform such that, for each bit position at which that block of transmitted bits could have commenced, a first group of sample values is recovered that would correspond to the first group of transmitted bits if the block of transmitted bits had commenced at that bit position and a second group of sample values is recovered that would correspond to the second group of transmitted bits if the block of transmitted bits had commenced at said bit position.

16. A method as claimed in claim 15, wherein the demodulated waveform is further received according to a protocol such that for each block of transmitted bits the function by which the respective second group of bits comprised in that block of transmitted bits is derived from the respective first group of bits is one of a plurality of functions defined by the protocol, the method comprising:
    for each block of transmitted bits, each function defined by the protocol and each of the first and second groups of sample values associated with a respective bit position at which the block of transmitted bits could have commenced, generating a set of candidates by applying that function to each first group of candidate bits formed from the first group of sample values associated with that respective bit position to generate a respective second group of candidate bits.

17. A method as claimed in claim 16, comprising performing the correlation operation by determining a correlation between each candidate comprising a first group of candidate bits formed from a first group of sample values associated with a respective bit position and the recovered first and second groups of sample values associated with that respective bit position to form a correlation value associated with that candidate.

18. A method as claimed in claim 17, comprising, for each set of candidates, selecting the candidate associated with the correlation value that is indicative of the strongest degree of correlation between a candidate and its corresponding first and second groups of sample values.

19. A method as claimed in claim 17, comprising determining a likelihood of a specific one of the plurality of functions having been used in forming a block of transmitted bits by performing an integration operation on correlation values associated with different blocks of transmitted data.

20. A method as claimed in claim 17, comprising determining a likelihood of a block of transmitted bits having commenced at a specific bit position by performing an integration operation on correlation values associated with different blocks of transmitted data.

21. A method as claimed in claim 19, comprising performing the integration operation on the correlation values that are associated with the selected candidate from each candidate set formed using a specific one of the plurality of functions and a specific commencement bit position so as to form a likelihood, for each block of transmitted bits, that a specific combination of function and commencement bit position was used to form that block of transmitted bits.

22. A method as claimed as claimed in claim 21, comprising summing combined likelihoods associated with specific ones of the functions and specific ones of the blocks of transmitted data bits to form function likelihoods indicative of a likelihood that specific ones of the blocks of transmitted data bits were formed using specific ones of the functions and selecting as the function most likely to have been used to form a block of transmitted bits the function corresponding to the highest function likelihood associated with that block of transmitted data bits.

23. A method as claimed in claim 22, comprising, for each block of transmitted data bits, selecting as the bit position at which the block of transmitted data bits is most likely to have commenced the bit position corresponding to the likelihood having the highest value that is associated with the function determined to be the function most likely to have been used to form that block of transmitted bits.

24. An apparatus configured to receive a demodulated waveform according to a protocol in which the waveform represents a block of transmitted bits comprising a first group of bits and a second group of bits, the second group of bits being a function of the first group of bits, the apparatus comprising:

a sampling module configured to sample the received demodulated waveform to recover a first group of sample values corresponding to the first group of transmitted bits and a second group of sample values corresponding to the second group of transmitted bits;

a reliability module configured to assign bit values to reliable sample values of the first group of sample values;

a candidate word generator configured to generate a set of candidates for a block of bits corresponding to the received demodulated waveform, each candidate comprising a first group of candidate bits and a second group of candidate bits, the first group of candidate bits being generated using the assigned bit values and a combination of bit values unique to that candidate in the set of candidates, and the second group of candidate bits being generated by applying the said function to the first group of candidate bits; and a correlator configured to perform a correlation operation by determining a correlation between each candidate and the recovered first and second groups of sample values to form a correlation value associated with each candidate;

wherein the candidate word generator is further configured to select the candidate associated with the correlation value that is indicative of the strongest degree of correlation between a candidate and the first and second groups of sample values to be the block of bits corresponding to the received demodulated waveform.

* * * * *

UNITED STATES PATENT AND TRADEMARK OFFICE
CERTIFICATE OF CORRECTION

PATENT NO. : 8,649,469 B2
APPLICATION NO. : 13/130928
DATED : February 11, 2014
INVENTOR(S) : Chunyang Yu et al.

It is certified that error appears in the above-identified patent and that said Letters Patent is hereby corrected as shown below:

In the Specification:

At column 7, line number 32, delete "10 $\log_{10}(B^2/P)$" and replace with --10$\log_{10}(B^2/P)$--.
At column 14, equation 15, line number 31, delete the portion of the equation "mod(m,104)" and replace with --mod($n$,104)--.

Signed and Sealed this
Sixth Day of May, 2014

Michelle K. Lee
*Deputy Director of the United States Patent and Trademark Office*